US010345484B2

(12) United States Patent
Lundy et al.

(10) Patent No.: US 10,345,484 B2
(45) Date of Patent: Jul. 9, 2019

(54) STORM CONFIRMATION AND PATH PREDICTION SYSTEM

(71) Applicant: Southern Company Services, Inc., Atlanta, GA (US)

(72) Inventors: Brandon Lundy, Birmingham, AL (US); Derl W. Rhoades, Gardendale, AL (US)

(73) Assignee: SOUTHERN COMPANY SERVICES, INC., Atlanta, GA (US)

( * ) Notice: Subject to any disclaimer, the term of this patent is extended or adjusted under 35 U.S.C. 154(b) by 230 days.

(21) Appl. No.: 14/842,083

(22) Filed: Sep. 1, 2015

(65) Prior Publication Data

US 2017/0059744 A1  Mar. 2, 2017

(51) Int. Cl.
*G01W 1/10* (2006.01)
*G01D 4/00* (2006.01)
*G01R 21/133* (2006.01)

(52) U.S. Cl.
CPC .............. *G01W 1/10* (2013.01); *G01D 4/002* (2013.01); *G01R 21/1333* (2013.01); *Y02B 90/241* (2013.01); *Y04S 20/32* (2013.01); *Y04S 20/36* (2013.01); *Y04S 20/48* (2013.01)

(58) Field of Classification Search
CPC .................................................... G06Q 50/06
USPC ......................................................... 708/7.12
See application file for complete search history.

(56) References Cited

U.S. PATENT DOCUMENTS

| | | | | |
|---|---|---|---|---|
| 9,236,762 B2 * | 1/2016 | John | ................... | H02J 7/35 |
| 2011/0055204 A1 * | 3/2011 | Jung | ................... | G06F 17/3087 |
| | | | | 707/722 |
| 2012/0072039 A1 * | 3/2012 | Anderson | .......... | G05B 13/0265 |
| | | | | 700/291 |
| 2014/0099496 A1 * | 4/2014 | Attard | ................... | B32B 5/02 |
| | | | | 428/221 |
| 2015/0262110 A1 * | 9/2015 | Henriques | .............. | G06Q 50/06 |
| | | | | 705/7.14 |
| 2015/0278596 A1 * | 10/2015 | Kilty | .................. | G06K 9/00476 |
| | | | | 382/113 |
| 2016/0109495 A1 * | 4/2016 | Sterkel | .................. | G06F 17/212 |
| | | | | 702/62 |

OTHER PUBLICATIONS

Matthews, J. et al., "An Improved Storm Cell Identification and Tracking (SCIT) Algorithm based on DBSCAN Clustering and JPDA Tracking Methods," 21st International Lightning Detection Conference, 3rd International Lightning Meteorology Conference, Apr. 19-22, 2010, 21 pp.*

* cited by examiner

*Primary Examiner* — Min Huang

(74) *Attorney, Agent, or Firm* — Thomas Horstemeyer, LLP

(57) ABSTRACT

Disclosed are various embodiments for confirming a tornado event has contacted a ground surface and for generating a path prediction. Upon receipt of power outage alarms from metering devices, the Advance Metering Infrastructure (AMI) application can generate cluster areas based on the location of the metering devices. The AMI application can compare a cluster area to a tornado pattern to determine if the cluster area has experienced a tornado event. The AMI application can determine a speed and a direction of the tornado event based on the location and a time stamp of a power outage associated with the metering devices in the cluster areas.

20 Claims, 10 Drawing Sheets

M1   M2

S = (CoordM2− CoordM1)/(TsM2− TsM1)

STORM CONFIRMATION AND PATH PREDICTION SYSTEM

BACKGROUND

Advanced Metering Infrastructure (AMI) deployments are increasing in prevalence because the AMI deployments can reduce labor costs as well as provide real-time data associated with a fleet of utility meters. In particular, AMI metering devices can report real-time power outage data to a user interface for a region or service area. A power outage may occur because of a weather related event in the area of the metering device. As a result, the real-time data associated with the fleet of meters can be used to indicate the effect of weather in an area.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAIL DESCRIPTION

Disclosed herein are various embodiments of systems and methods related to confirming a tornado event that has touched the ground and predicting a path of the tornado event. Currently, existing weather forecasting and analysis tools lack the capability of determining when a tornado has touched the ground. In some instances, current methods of determining whether a tornado has touched the surface include a group of individuals tracking a tornado in the surrounding areas.

Figure 1:
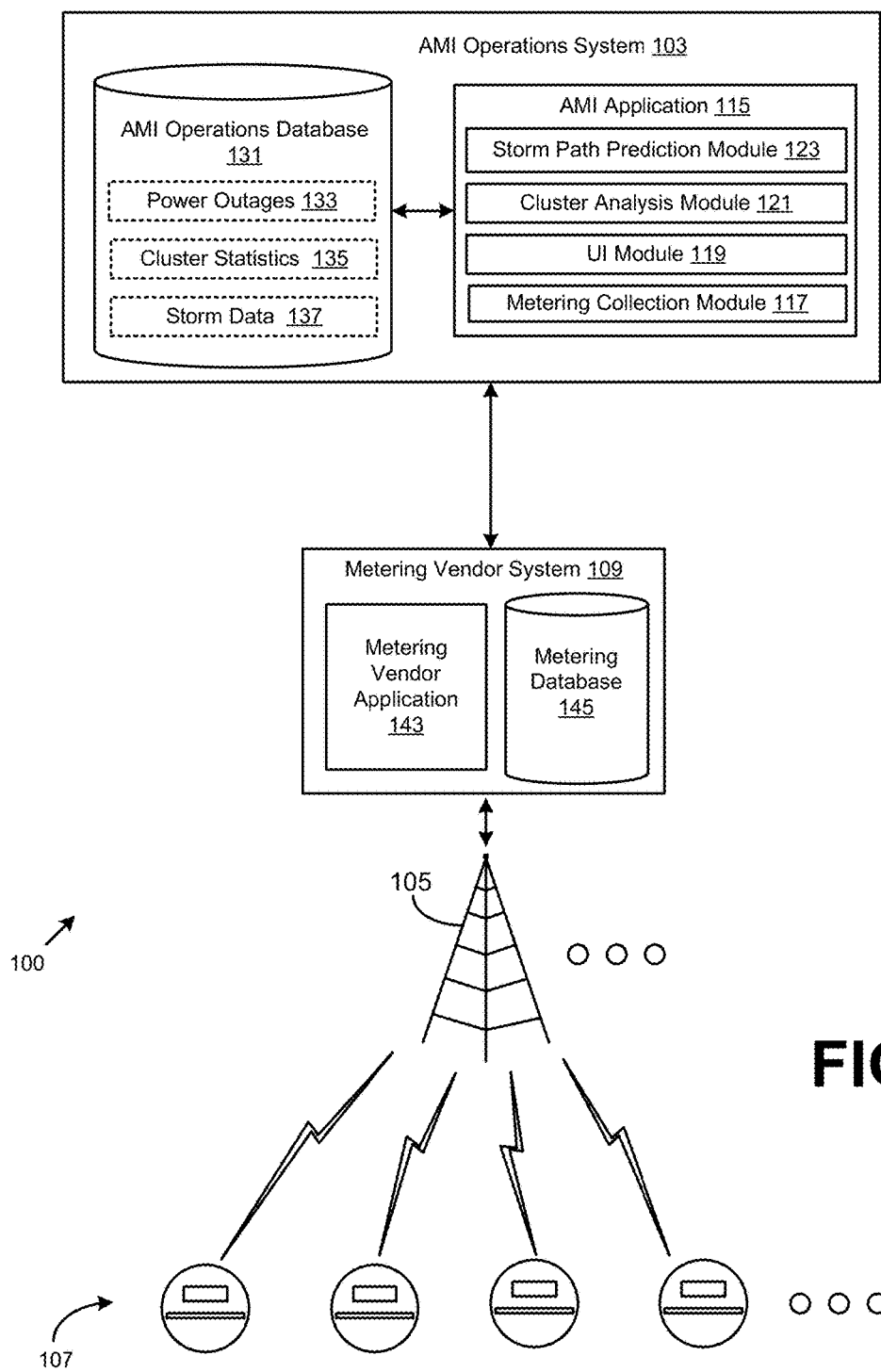
FIG. 1 illustrates an example of an AMI deployment environment, according to various embodiments of the present disclosure.

References will now be made in detail to the description of the embodiments as illustrated in the drawings. With reference to FIG. 1, shown is an AMI utility metering environment 100 according to various embodiments. The utility metering environment 100 includes an AMI operations system 103 in communication with a metering infrastructure. The metering infrastructure can, in one non-limiting embodiment, include one or more communications towers 105 or tower gateway base stations (TGB) that can receive utility usage information from a fleet of utility metering devices 107 that are deployed at various customer premises. Additionally, a metering vendor facilitating deployment of an AMI utility metering environment often provides ahead-end system or regional network interface (RNI), or a metering vendor system 109, which interfaces with the various communications towers 105 in a deployment to collect usage data, alarm messages, and other statistics, values, and metrics that can originate from the metering devices 107 and/or the communications towers 105.

The AMI operations system 103 and metering vendor system 109 may comprise, for example, a computing device, a server computer, or any other system providing computing capability or resources. Alternatively, a plurality of computing devices may be employed that are arranged, for example, in one or more server banks or computer banks or other arrangements. For example, a plurality of computing devices together may comprise, for example, a cloud computing resource, a grid computing resource, and/or any other distributed computing arrangement. Such computing devices may be located in a single installation or may be distributed among many different geographical locations. Additionally, some components executed on a computing device can be executed in one installation, while other components can be executed in another installation. For purposes of convenience, the computing device is referred to herein in the singular. Even though the computing device is referred to in the singular, it is understood that a plurality of computing devices may be employed in the various arrangements as described above.

The communications towers 105 can be configured to receive power outage data, usage data, alarm messages such power outage alarms, or other information from utility metering devices 107 deployed in an AMI deployment. As should be appreciated, utility metering devices 107 can be configured to provide one-way communication or two-way communication to report usage data associated with a meter, status information, alarm messages, and other administrative data. Additionally, in two way systems, administrative information or various commands that can cause a utility metering device 107 to take some course of action can be transmitted to the utility metering devices 107 via a communications tower 105. As one example, the AMI operations system 103 and/or metering vendor system 109 can transmit a command via the communications towers 105 causing a utility metering device 107 to report usage data. It should further be appreciated that a utility metering device 107 can also interact with any system (e.g., a computing device, a metering collection device, a vehicle mounted metering collection device, a mobile collector, a local area fixed collector, etc.) complying with a communications protocol specified by the metering infrastructure, regardless of whether such a system is transmitting data and/or messages via the depicted communications towers 105.

The utility metering device 107 may comprise a computing device, a voltage sensor, a current sensor, and a radio frequency transceiver. In some embodiments, the utility metering device 107 can generate a power outage alarm by measurements received from the current sensor and/or voltage sensor. As one non-limiting example, the utility metering device 107 can have established conditions for a power outage alarm and such conditions can relate to particular measurements received from the current sensor and/or voltage sensor.

The utility metering devices 107 can, in some embodiments, transmit and/or receive data wirelessly to and from the depicted metering vendor system 109 via one or more communications towers 105. In one embodiment, metering devices 107 can communicate with the metering vendor system 109 via wireless messages in a proprietary or non-proprietary format in licensed or unlicensed wireless spectrum. In other embodiments, the metering devices 107 can communicate with the metering vendor system 109 via standardized cellular communications technology such as, but not limited to, GPRS, CDMA, and other technologies as can be appreciated.

Various applications and/or other functionality may be executed in the AMI operations system 103 according to various embodiments. In the depicted non-limiting embodiment, the meter AMI operations system 103 can execute an AMI application 115 that can include various modules that facilitate the functionality described herein. It should be appreciated that the depicted arrangement of an AMI application 115 executing various modules is but one non-limiting example of an arrangement of an embodiment of the disclosure given for ease of depiction as well as discussion herein. It should also be appreciated that embodiments of the disclosure can be implemented in various ways.

The AMI application 115 can execute a metering collection module 117 that collects metering device data received from one or more communications towers 105 and/or metering devices 107 in an AMI deployment. For a respective metering device 107, the metering device data can include power outage data, energy consumption data, and metering device settings. The AMI application 115 can also execute a user interface (UI) module 119 that can generate an administrative user interface, allowing utility operations personnel to visualize the status of an AMI deployment. The cluster analysis module 121 is executed to analyze the power outage data from the fleet of metering devices 107 and generate cluster areas of high density power outages. The AMI application 115 can also execute a storm path prediction module 123 that can identify whether a portion of the power outage data has been caused by a tornado event. The storm path prediction module 123 then can calculate a speed and direction of the tornado event. Accordingly, the storm path prediction module 123 can predict which additional metering devices 107 and areas will experience a power outage due to the tornado.

The metering vendor system 109 is often provided by vendors of equipment in an AMI deployment to facilitate interactions with communications towers 105 and/or utility metering devices 107. Accordingly, the metering vendor system 109 can include a metering vendor application 143 with which the AMI operations system 103 can interact as well as a metering database 145 that stores messages received from one or more communications towers 105 and/or metering devices 107 in the AMI deployment. In some embodiments, the AMI operations system 103 can interact directly with a metering database 145 maintained by the metering vendor system 109. The metering vendor system 109 can receive metering device data from either communications towers 105 or from the metering devices 107 in a deployment. Additionally, the metering database 145 can maintain an archive of metering device data received from various devices in a deployment. As a result, the metering vendor system 109 can maintain statistics associated with power outages of metering devices in an AMI deployment, which can be used to gain a better understanding of outage patterns occurring in an AMI deployment.

The data stored in the AMI operations database 131 includes, for example, a power outage data 133, cluster statistics 135, and storm data 137, and potentially other data. The power outage data 133 can include real-time data related to utility metering devices 107 that have experienced a loss of power in an AMI deployment. In one embodiment, the power outage data 133 can include data related to power outages or some other sort of power failure for various regions or service areas. In other embodiments, power outage data 133 can include power outage statistics associated with a communication tower 105. Additionally, the power outage data 133 can maintain a history of power outages for individual utility metering devices 107.

In some embodiments, power outage data 133 can include a time stamp associated with a power outage event and a location of the utility metering device 107 experiencing the power outage. The location of the utility metering device 107 can be obtained by a Global Positioning System (GPS) device or a utility metering device 107 can report a known installation location associated with the device.

The AMI operations database 131 can also include cluster statistics 135 data on the cluster areas generated by the cluster analysis module 121. Some examples of information maintained on the generated cluster areas that can be stored include data associated with utility metering devices 107 that are included in a particular cluster area, density-based cluster measurements, and the dimensions of the cluster area. Real-time power outage data 133 associated with utility metering devices 107 can be dynamic. Accordingly, in some embodiments, the data associated with the cluster areas can be updated in real-time.

The AMI operations database 131 can additionally include storm data 137 that includes data associated with storm patterns and weather forecasts. In one non-limiting example, the storm data 137 can include density related storm patterns from previous storms. In particular, the storm data 137 can maintain a tornado pattern associated with a previous occurrence. The storm pattern can include information such as a traversed path, metering devices 107 that experienced outages, and corresponding density metrics associated with the metering devices 107 experiencing outages. Accordingly, the storm data 137 can be employed by AMI Application 115 to determine whether a cluster area has experienced a tornado event.

Now, having generally described the various components in the AMI utility metering environment 100, description of operation of the AMI application 115 will be described. As described above, the AMI application 115 can, in one embodiment, execute various modules that provide varying functionality. The metering collection module 117 can receive utility metering data from a communication tower 105 and/or metering device 107. The metering collection module 117 can store energy usage data and power outage events in power outage data 133 in the AMI operations database. In one non-limiting example, the metering collection module 117 can report power outage events in real-time.

The cluster analysis module 121 can analyze power outage events associated with utility metering devices 107 and generate cluster areas from the power outage events. In some embodiments, Density-based spatial clustering of applications with noise (DBSCAN) methods are used to generate the cluster areas and reshape the size of the cluster area. The DBSCAN methods may include performing density measurements such as a directly density-reachable measurement, a density-reachable measurement, a density-connectable measurement, or other types of density measurements. These are example methods of determining metering devices with density reachable locations with respect to the core point, i.e. a given metering device reporting a power outage and having a sufficient number of other metering devices reporting a power outage within its radius, as will be described.

In one non-limiting example, the cluster analysis module 121 can identify core utility metering devices from the utility metering devices reporting power outage events. Additionally, the cluster analysis module 121 can identify border utility metering devices from utility metering devices reporting power outage events. The cluster analysis module 121 can then determine a cluster area after identifying the core utility metering devices and border utility metering devices. Further, the cluster analysis module 121 can reshape a particular cluster area as more border utility metering devices are identified. The cluster analysis module 121 can also determine whether a particular cluster area has a density level above a density threshold. In addition, the cluster analysis module 121 can measure the dimensions of the generated cluster and store the cluster area measurements in the cluster statistics 136.

The storm path prediction module 123 can interact with the cluster statistics 135 and the cluster analysis module 121 to confirm whether power outage events likely occurred because of a tornado event. Further, the storm path prediction module 123 can confirm whether the tornado event has touched the ground. The storm path prediction module 123 can also determine the speed and direction of the tornado event. In addition, the storm path prediction module 123 can analyze the speed and direction of the tornado event to extrapolate a path prediction. In some embodiments, a path prediction may include identifying utility metering devices 107 that will likely experience a power outage within a calculated time period because of the tornado event.

The user interface (UI) modules 119 can interact with the metering collection module 117, the cluster analysis module 121, and the storm path prediction module 123 to generate an administrative user interface on a client device. The UI module 119 renders for display visuals representing power outage events for metering devices 107 and power outage patterns. The UI module 119 can illustrate on a map the density of power outage events. Additionally, the UI module 119 can illustrate cluster areas, which can represent geographic areas that have a confirmed tornado landing and a path prediction. In some embodiments, the UI module 119 can generate a real-time power outage layer on a map of a geographic area. The UI module 119 can also generate a storm layer on a map to illustrate cluster areas, a tornado path prediction, and powered utility metering devices 107 that are within a defined proximity to the predicted path. Example user interfaces generated by the UI module 119 are discussed in further detail herein with reference to FIGS. 3A and 3B.

Figure 2:
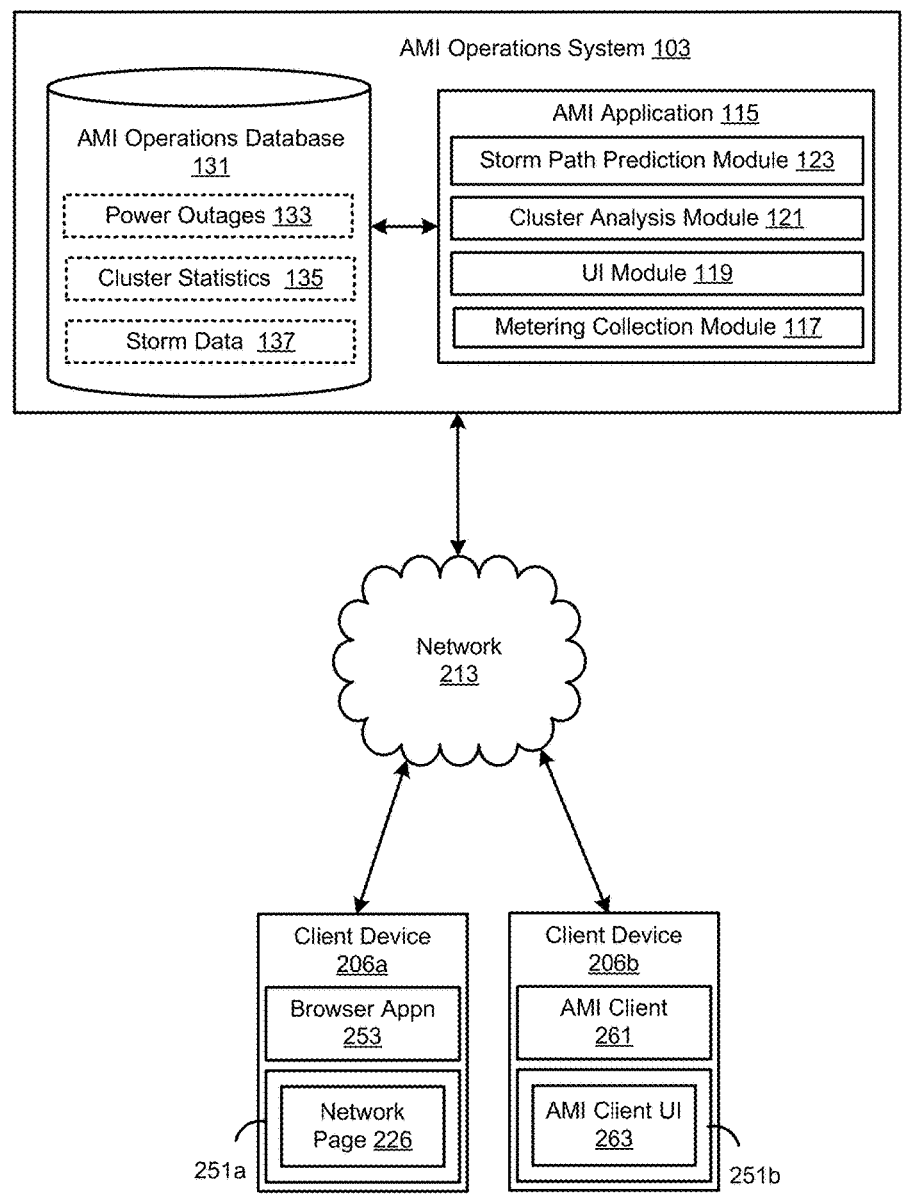
FIG. 2 is a drawing of the AMI operations system of FIG. 1 in communication with one or more clients, according to various embodiments of the present disclosure.

Reference is now made to FIG. 2, which depicts at least one client device 206a, 206b in communication with the AMI operations system 103. A client device 206a, 206b can be coupled to the network 213 in order to communicate with the UI module 119 to view an administrative user interface as noted above. The network 213 includes, for example, the Internet, intranets, extranets, wide area networks (WANs), local area networks (LANs), wired networks, wireless networks, or other suitable networks, etc., or any combination of two or more such networks. The client devices 206a, 206b may comprise, for example, a processor-based system such as a computer system. Such a computer system may be embodied in the form of a desktop computer, a laptop computer, a computer tablet, a personal digital assistant, a mobile device (e.g. cellular telephone, smart phone, etc.), set-top box, music players, web pads, tablet computer systems, or other devices with like capability.

The client device 206a may be configured to execute various applications such as a browser application 253 and/or other applications. The browser application 253 may be executed in a client device 206a, for example, to access and render network pages 226, such as web pages, or other network content served up by the AMI operations system 103 and/or other servers. The client device 206a may be configured to execute applications beyond browser application 253 such as, for example, an email client for receiving email generated by the AMI application 115, instant message applications, an application specifically tailored to access resources of the AMI operations system 103, and/or other applications as can be appreciated. The client device 206a can include a display device 251 upon which various network pages 226 in which an administrative user interface can be rendered by the browser application 253. A client device 206b can also include a computing system on which an AMI client 261 tailored to interact with the UI module 119 and display a customized AMI client user interface 263. As one example, the AMI client 261 can include client side code that enhances a user experience by providing more complex user interface elements and other functionality and facilitates interaction with the UI module 119.

Figure 3A:
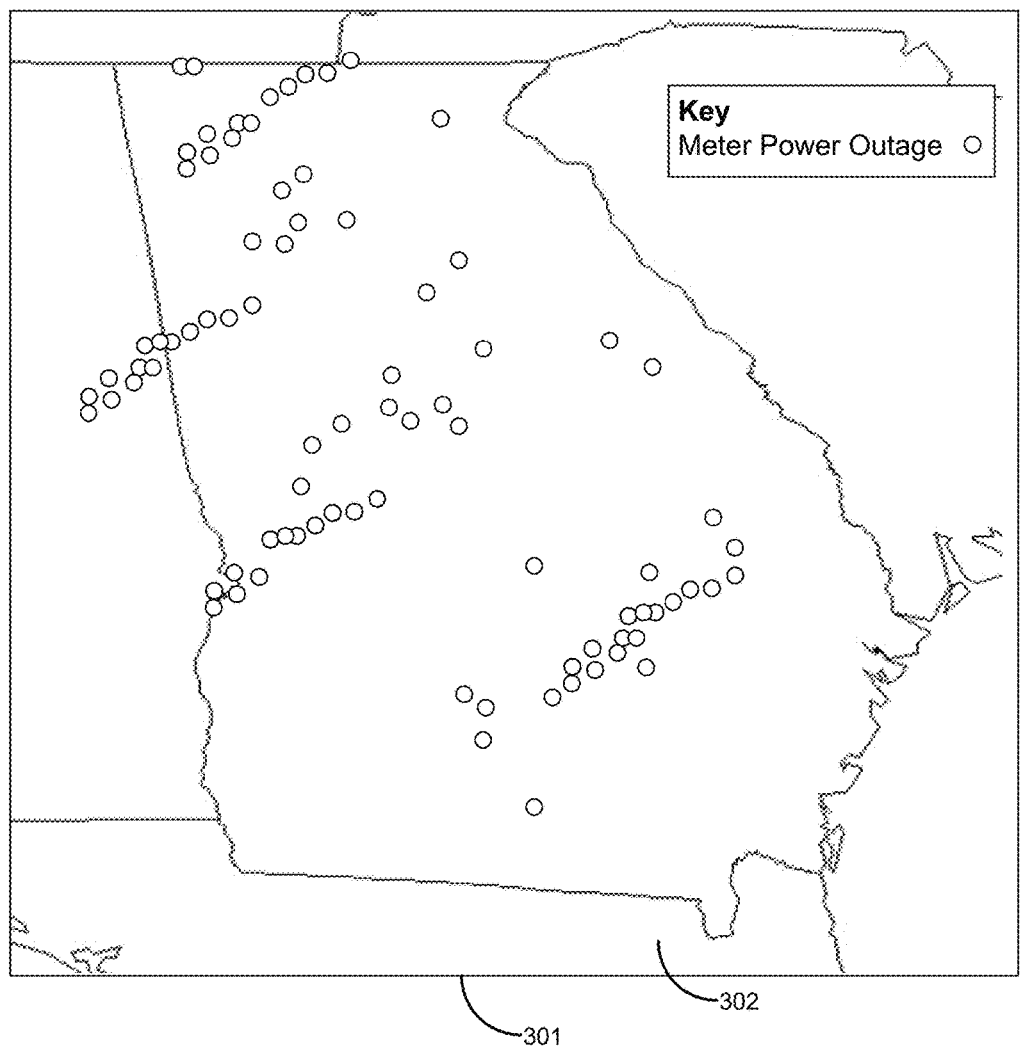
FIGS. 3A and 3B illustrate examples of user interfaces rendered by a client device of a real-time power outage map and a storm path prediction tool, according to various embodiments of the present disclosure.

Referring to FIG. 3A, shown is one non-limiting example of a user interface of a real-time power outage map that is rendered on a client device 206 and that is facilitated by the UI module 119. The depicted user interface 301 facilitates visualization of a power status of an AMI deployment by showing various data associated with metering devices 107. In one embodiment, the UI module 119 can generate a meter power outage indicator on a map user interface element 302. The meter power outage indicators can represent a metering device 107 that has experienced a power outage. Because the location of a metering device 107 can be known or ascertained, the UI module 119 can generate a meter power outage indicator at a representative location on the map user interface element 302.

A metering device 107 can experience a power outage event because of a storm, a tornado, or some non-weather related event. The non-weather related events can be indicated on the map user interface element 302. In one embodiment, a power outage event may occur because a power company shut off power for maintenance reasons. Non-weather related power outage events can be entered into the AMI operations database 131 and distinguished from weather related power outage events.

The metering device 107 can report power outage events from zero to 120 seconds after a power outage has occurred at the metering device 107. As such, the user interface 301 can be dynamically updated to illustrate new power outage events shortly after the power outage occurs. In some embodiments, the power outage events may be depicted with a particular color indicator, an indicator of a particular shape, or a flashing indicator. In other embodiments, the UI module 119 can scan the metering devices 107 at a variable rate set by an operator.

Figure 3B:
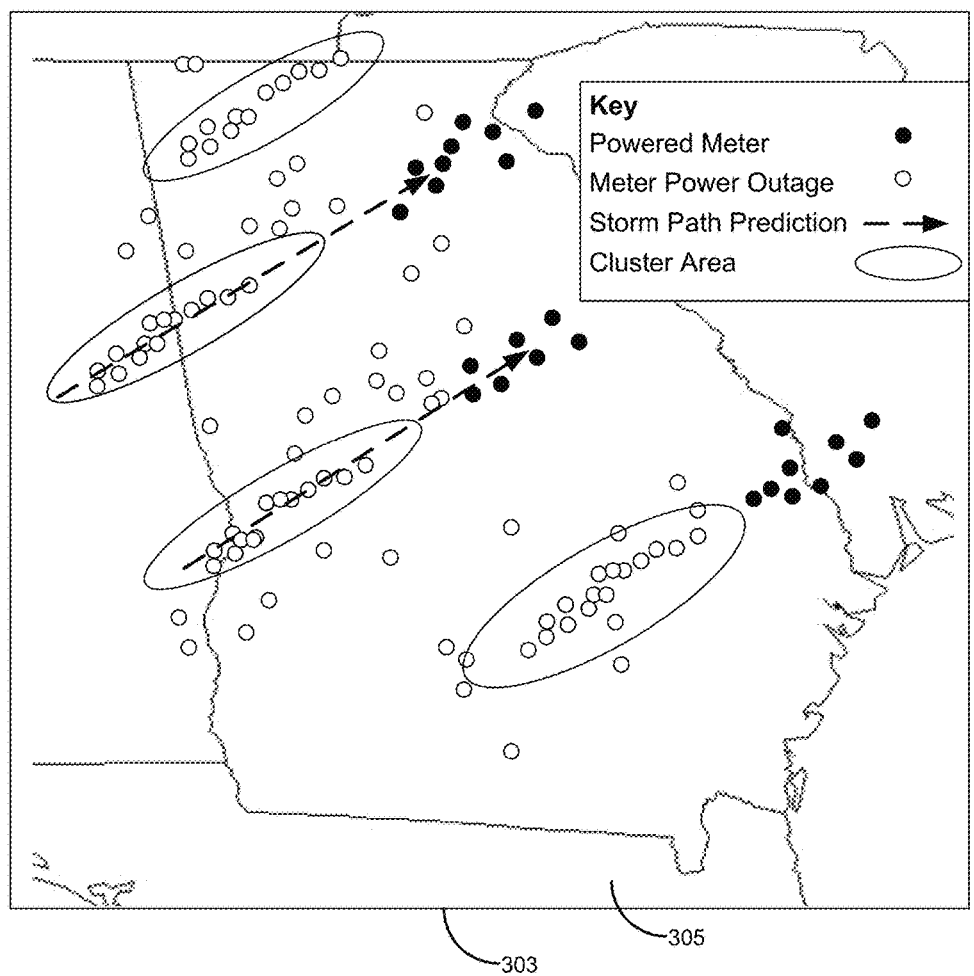

Referring to FIG. 3B, shown is one non-limiting example of a user interface of a storm path prediction user interface 303 that is rendered on a client device 206 and that is facilitated by the UI module 119. The storm path prediction user interface 303 facilitates displaying indicators of confirmed tornado events and a corresponding path prediction of a respective tornado event. The storm path prediction user interface 303 comprises a powered metering device indicator, a power outage indicator for a metering device 107, a storm path prediction indicator, and a cluster area indicator. In one embodiment, a storm path prediction user interface 303 may comprise a storm path prediction layer and a real-time power outage reporting a layer overlaid a geographic map of a region or service area.

In some embodiments, the UI module 119 can generate power outage indicators on a map user interface element 302. The power outage indicators can represent a metering device 107 that has experienced a power outage at a location representative of the metering device 107. In addition, the UI module 119 can depict the generated cluster areas on the map user interface element 302. As noted above, cluster areas are generated by the cluster analysis module 121. The UI module 119 can generate visualizations that illustrate which metering devices 107 can be a part of a particular cluster area.

The UI module 119 can also generate a visualization of a storm path prediction. In one non-limiting example, as shown in FIG. 3B, an arrow represents a predicted path of a tornado event. The storm path prediction module 123 can provide an analysis of the cluster areas to confirm whether the power outage of the metering devices 107 was triggered by a tornado event. The storm path prediction module 123 can then calculate a speed and direction of the tornado event. Based on the speed and direction of the tornado event, the storm path prediction module 123 extrapolates from the existing power outage events to areas that could experience power outage within a calculated time period. The UI module 119 illustrates the extrapolation on the map user interface element 305. As shown in FIG. 3B, the UI module 119 can also illustrate the metering devices 107 that will likely experience a power outage because the metering devices 107 are within a predefined radius of the predicted path of the tornado event.

Figure 4:
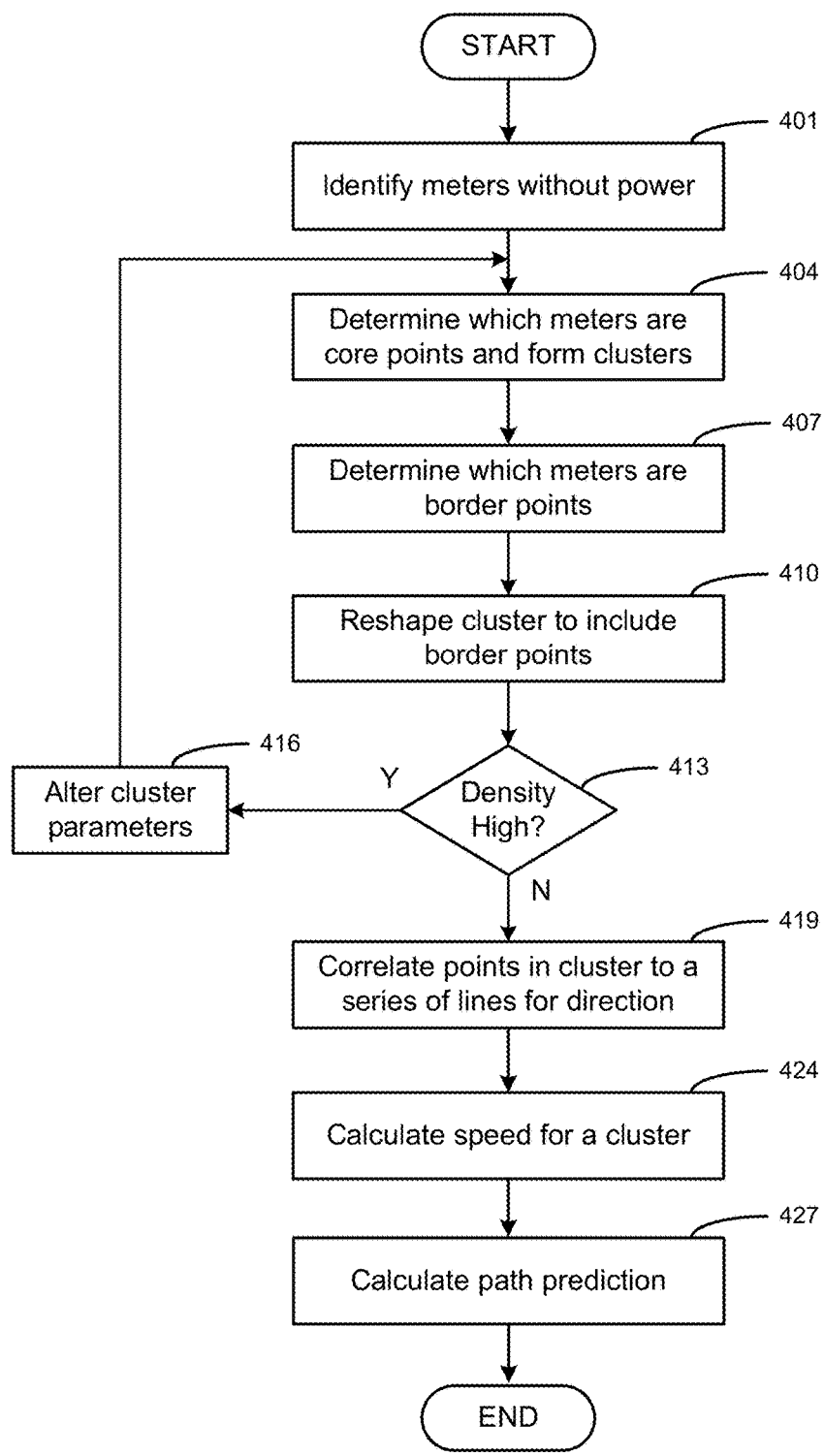
FIG. 4 is a flowchart illustrating an example of functionality implemented as portions of an AMI application executed in the AMI operations system of FIG. 1, according to various embodiments of the present disclosure.

With reference to FIG. 4, shown is a flowchart illustrating an example of functionality implemented as portions of an AMI application 115 executed in the AMI operations system of FIG. 1. More specifically, FIG. 4 depicts one example of executing a series of instructions processed in the AMI application 115 to confirm a weather occurrence as a tornado event that has made contact with the ground or come substantially near the ground. To begin, in box 401, the AMI application 115 identifies the metering devices 107 that have generated a power outage alarm. With respect to box 401, a first step can comprise the AMI application 115 receiving a metering data stream from a metering database and/or from a fleet of metering devices 107. A second step can comprise identifying the metering devices 107 that have generated the power outage alarm from the metering data stream their respective location associated with the metering devices 107. That is, the metering data stream can include a power outage status of individual metering devices 107 and a location of the metering device 107 reporting the power outage status. The AMI application 115 can then identify the metering devices 107 that are experiencing a power outage.

In box 404, the AMI application 115 can determine which of the identified metering devices 107 to classify as a core point and form cluster areas based on a core point. With respect to box 404, a first step can comprise the AMI application 115 determining a radius value, which can be dynamically adjusted. The second step can comprise the AMI application 115 determining the number of identified metering devices 107 within the radius of a particular identified metering device 107. The area and the metering devices 107 within the radius can be referred to as a neighborhood for a respective metering device 107. The third step can comprise comparing the number of identified metering devices 107 within the neighborhood to a threshold value. If the number of metering devices 107 exceeds a threshold quantity for the neighborhood, then the particular identified metering device 107 can be classified as a core point. As can be appreciated, the threshold quantity for the neighborhood can be dynamically changed. The fourth step can comprise forming a cluster area based on a core point and the metering devices 107 that are within the neighborhood of the core point.

In box 407, the AMI application 115 then can determine which of the metering devices 107 that generated a power outage alarm can be identified as a border point. In various embodiments of the present disclosure, border points can be determined based on different density-based spatial clustering techniques. For example, a directly density-reachable, density-reachable, or density-connectable measurements can be employed to determine which of the identified metering devices 107 can be classified as a border point.

As one non-limiting example, the AMI application 115 may first use a directly density-reachable measurement to determine border points for a cluster area. In this example, the AMI application 115 can perform density measurements to determine which metering devices are reachable to the core point. As a first step, the AMI application 115 can determine whether a particular metering device 107 can be directly-reachable to the core point. The particular metering device 107 is direct-reachable to the core point when the particular metering device 107 is within the neighborhood of the core point. That is, the particular metering device 107 is located within the radius value discussed above. If so, the second step can comprise the particular metering device 107 being classified as a border point. The process is reiterated for each metering device 107 that has generated a power outage alarm with respect to a respective core point. Next, for a density-reachable measurement, the AMI application 115 can execute an additional step for the directly-reachable measurement. For example, as a third step, the AMI application 115 can classify additional identified metering devices 107 as border points by determining if there is a path of directly-reachable metering devices 107 from the core point, metering device 107, to another particular metering device 107.

In other words, after the first border points are determined from the directly-reachable measurement, the AMI application 115 can classify additional metering devices 107 that have generated a power outage alarm as a border point if the metering devices 107 are within a radius of a border point. The process is reiterated for each border point.

In another embodiment, the AMI application 115 can use a density-connected measurement technique. As one non-limiting example, the AMI application 115 can classify additional identified metering devices 107 as border points by determining if there is a metering device 107, e.g. point o, such that both the core point and the particular metering device 107 are directly density-reachable with respect to point o. In other words, there is a common point that is directly density-reachable to both the border point and the core point.

In box 410, the AMI application 115 can reshape the cluster area to include the additional border points identified by a density measurement. In other words, the cluster area can be extended to include the additional border points.

Then, in box 413, in some embodiments, the AMI application 115 can determine whether the density of the metering devices 107 in the cluster area exceeds a density threshold. If the density of the metering devices 107 exceeds the density threshold, in box 416, the AMI application 115 can alter the radius value and/or the neighborhood threshold quantity. The AMI application 115 can then proceed to box 404 to reclassify the metering devices 107 as core and border points.

If not, the AMI application 115 can proceed to box 419 to correlate the metering devices 107 in the cluster area to formulate a series of straight lines. As discussed above, the power outage status comprises a time stamp of the power outage for each of the metering devices 107. Therefore, as a first step, at least two metering devices 107 within the cluster area are selected, and a straight line is formed between the two metering devices. As a second step, a direction can be determined for the straight line based on comparing the time stamps of the metering devices 107 forming the line. This process is reiterated to generated a series of straight lines and determine a corresponding direction for each line. As a third step, the series of lines are correlated to determine a direction representative of the cluster area. In some embodiments, after the cluster area is identified it can be separated in N segments (N should be considered dynamic). The cluster area is evenly split into equal N segments based on distance, as illustrated in FIG. 6O. Inside of those segments all points are then correlated to a straight line. Once the line is created by correlation, the line's direction is determined based on the min and max timestamp of that segment.

In box 424, in some embodiments, the AMI application 115 can calculate the speed of a tornado event. In this context, the AMI application 115 can determine the speed based on the metering devices 107 in the cluster area. As mentioned above, the power outage status comprises a time stamp and a location of the power outage for each of the metering devices 107. As a first step, the AMI application 115 can determine the distance between two metering devices 107 on a line. As a second step, the AMI application 115 can determine time difference between the two metering devices on the line. As a third step, the AMI application 115 can calculate the speed based on the time difference and the distance between the metering devices 107.

In box 427, in some embodiments, the AMI application 115 can predict the path of a tornado event based on the speed and/or the direction of the tornado event. The path prediction can include a geographic area that the tornado event will likely travel within a calculated time period, or alternatively, an identification of metering devices 107 that will experience a power outage. In some embodiments, the AMI application 115 may incorporate into the path prediction additional factors such as previous tornado patterns, their corresponding metering outage density, their corresponding speed, their corresponding direction, and a distance traveled.

In some embodiments, after determining the path of the tornado event, the AMI application 115 can facilitate sending emergency alerts to electronic devices in a geographic area within a predefined distance from the predicted tornado path. In one embodiment, the AMI application 115 can communicate with computing devices associated with public safety officials, such as local or state officials, for authorization. After receiving approval, the AMI application 115 can communicate the emergency alert to wireless carriers providing service in the area. The wireless carriers can push the emergency alert to cell phone, smart phones, tablets, and other mobile devices. In another embodiment, the AMI application 115 can communicate with cable and telecommunication service providers. In this context, community residents and businesses could receive alerts via television prompts, automated telephone messages, or some other means available to service providers for emergency situations.

In some embodiments, the AMI application 115 can classify each identified metering device 107 as either a core point, a border point, or a noise point. Additionally, the AMI application 115 can determine whether if any other the classified points belong to a cluster area or not.

Figure 5:
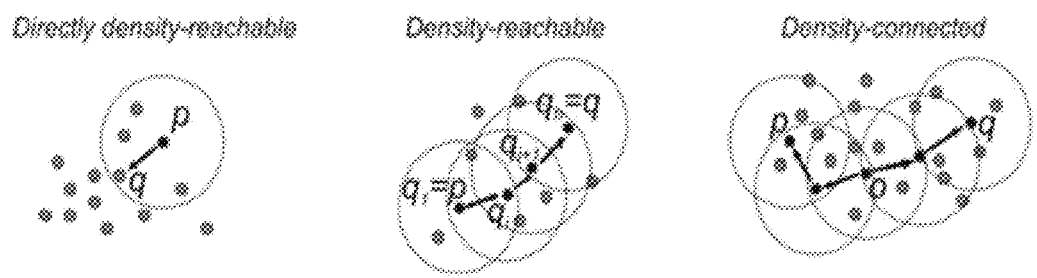
FIG. 5 illustrates examples of density reachable cluster measurements, according to various embodiments of the present disclosure.

With reference to FIG. 5, shown are examples of density reachable measurements. FIG. 5 depicts three non-limiting examples of the density reachable measurement techniques discussed above. Clustering analysis techniques can be used to identify tornado events because tornados, as they contact the ground, can cause condensed patterns of power outages as it travels across an area. Thus, previous patterns of power outages caused by tornados can be used to compare with a current series of power outage to confirm a tornado event is occurring in an particular area. In contrast, other severe storms tend to cause power outages in a broader geographic area and/or the power outages tend to occur randomly. In other embodiments, a distribution-based clustering analysis can be implemented to confirm tornado events in an area.

Figure 6A:
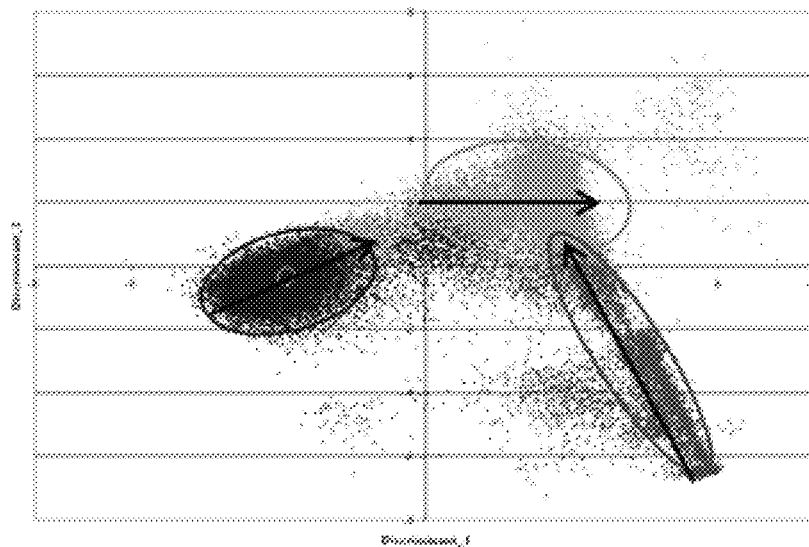
FIGS. 6A through 6C are graphs illustrating example methods of determining the speed and direction of a tornado event, according to various embodiments of the present disclosure.

With reference to FIG. 6A, shown is a graph illustrating an example method of determining the direction of a tornado event.

Figure 6B:
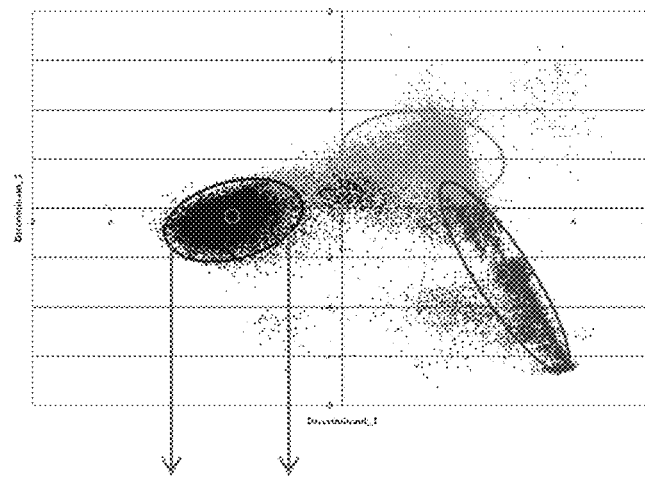

With reference to FIG. 6B, shown is a graph illustrating an example method of determining the speed of a tornado event.

Figure 6C:
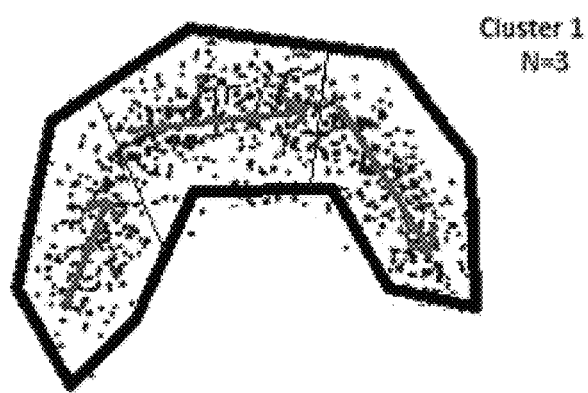

With reference to FIG. 6C, shown is a graph illustrating an example method of determining a direction for individual segments of the cluster area.

Figure 7A:
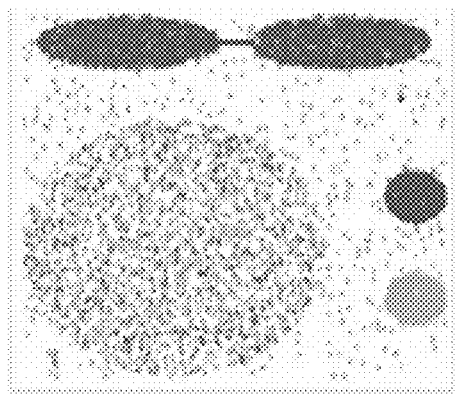
FIGS. 7A and 7B are graphs illustrating examples of high density cluster areas, according to various embodiments of the present disclosure.

With reference to FIG. 7A, shown is a graph illustrating an example of high density cluster areas with a radius value, epsilon, and a neighborhood quantity, Q.

Figure 7B:
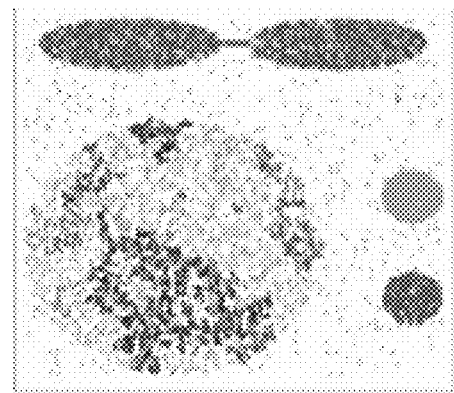

With reference to FIG. 7B, shown is a graph illustrating an example of the density of cluster areas with a different radius value and different neighborhood quantity.

Figure 8:
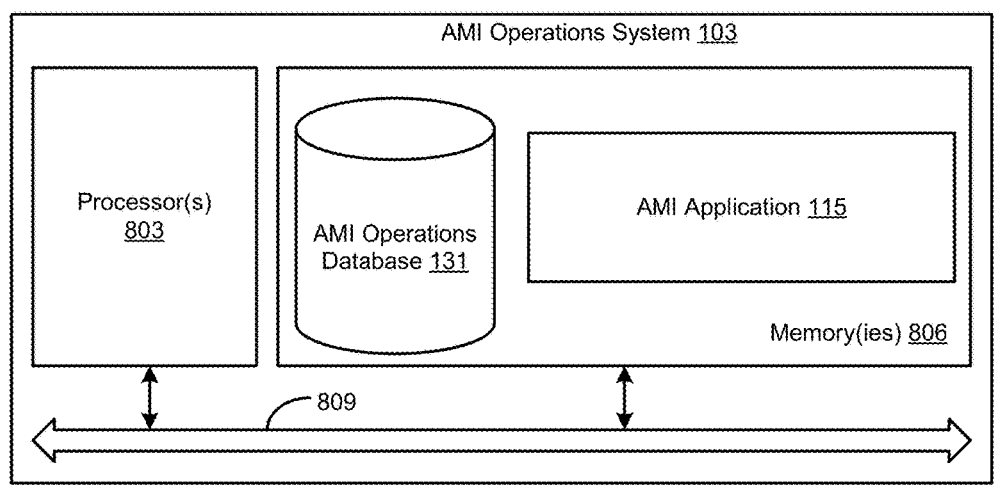
FIG. 8 is a schematic block diagram that provides one example illustration of an AMI operations system of FIG. 1 according to various embodiments of the present disclosure.

With reference to FIG. 8, shown is a schematic block diagram of the AMI operations system 103 according to an embodiment of the present disclosure. The AMI operations system 103 includes at least one processor circuit, for example, having a processor 803 and a memory 806, both of which are coupled to a local interface 809. To this end, the AMI operations system 103 may comprise, for example, at least one server computer or like device. The local interface 809 may comprise, for example, a data bus with an accompanying address/control bus or other bus structure as can be appreciated.

Stored in the memory 806 are both data and several components that are executable by the processor 803. In particular, stored in the memory 806 and executable by the processor 803 are the AMI application 115, and potentially other applications. Also stored in the memory 806 may be an AMI operations database 131 and other data. In addition, an operating system may be stored in the memory 806 and executable by the processor 803.

It is understood that there may be other applications that are stored in the memory 806 and are executable by the processors 803 as can be appreciated. Where any component discussed herein is implemented in the form of software, any one of a number of programming languages may be employed such as, for example, C, C++, C#, Objective C, Java, Javascript, Perl, PHP, Visual Basic, Python, Ruby, Delphi, Flash, ASP.Net or other programming languages.

A number of software components are stored in the memory 806 and are executable by the processor 803. In this respect, the term "executable" means a program file that is in a form that can ultimately be run by the processor 803. Examples of executable programs may be, for example, a compiled program that can be translated into machine code in a format that can be loaded into a random access portion of the memory 806 and run by the processor 803, source code that may be expressed in proper format such as object code that is capable of being loaded into a random access portion of the memory 806 and executed by the processor 803, or source code that may be interpreted by another executable program to generate instructions in a random access portion of the memory 806 to be executed by the processor 803, etc. An executable program may be stored in any portion or component of the memory 806 including, for example, random access memory (RAM), read-only memory (ROM), hard drive, solid-state drive, USB flash drive, memory card, optical disc such as compact disc (CD) or digital versatile disc (DVD), floppy disk, magnetic tape, or other memory components.

The memory 806 is defined herein as including both volatile and nonvolatile memory and data storage components. Volatile components are those that do not retain data values upon loss of power. Nonvolatile components are those that retain data upon a loss of power. Thus, the memory 806 may comprise, for example, random access memory (RAM), read-only memory (ROM), hard disk drives, solid-state drives, USB flash drives, memory cards accessed via a memory card reader, floppy disks accessed via an associated floppy disk drive, optical discs accessed via an optical disc drive, magnetic tapes accessed via an appropriate tape drive, and/or other memory components, or a combination of any two or more of these memory components. In addition, the RAM may comprise, for example, static random access memory (SRAM), dynamic random access memory (DRAM), or magnetic random access memory (MRAM) and other such devices. The ROM may comprise, for example, a programmable read-only memory (PROM), an erasable programmable read-only memory (EPROM), an electrically erasable programmable read-only memory (EEPROM), or other like memory device.

Also, the processor 803 may represent multiple processors 803 and the memory 806 may represent multiple memories 806 that operate in parallel processing circuits, respectively. In such a case, the local interface 809 may be an appropriate network that facilitates communication between any two of the multiple processors 803, between any processor 803 and any of the memories 806, or between any two of the memories 806, etc. The local interface 809 may comprise additional systems designed to coordinate this communication, including, for example, performing load balancing. The processor 803 may be of electrical or of some other available construction.

Although the AMI application 115 and other various systems described herein may be embodied in software or code executed by general purpose hardware as discussed above, as an alternative the same may also be embodied in dedicated hardware or a combination of software/general purpose hardware and dedicated hardware. If embodied in dedicated hardware, each can be implemented as a circuit or state machine that employs any one of or a combination of a number of technologies. These technologies may include, but are not limited to, discrete logic circuits having logic gates for implementing various logic functions upon an application of one or more data signals, application specific integrated circuits having appropriate logic gates, or other components, etc. Such technologies are generally well known by those skilled in the art and, consequently, are not described in detail herein.

The flowchart of FIG. 3 shows the functionality and operation of an implementation of portions of the AMI application 115. If embodied in software, each block may represent a module, segment, or portion of code that comprises program instructions to implement the specified logical function(s). The program instructions may be embodied in the form of source code that comprises human-readable statements written in a programming language or machine code that comprises numerical instructions recognizable by a suitable execution system such as a processor 703 in a computer system or other system. The machine code may be converted from the source code, etc. If embodied in hardware, each block may represent a circuit or a number of interconnected circuits to implement the specified logical function(s).

Although the flowcharts of FIG. 3 show a specific order of execution, it is understood that the order of execution may differ from that which is depicted. For example, the order of execution of two or more blocks may be scrambled relative to the order shown. Also, two or more blocks shown in succession in FIG. 3 may be executed concurrently or with partial concurrence. Further, in some embodiments, one or more of the blocks shown in FIG. 3 may be skipped or omitted. In addition, any number of counters, state variables, warning semaphores, or messages might be added to the logical flow described herein, for purposes of enhanced utility, accounting, performance measurement, or providing troubleshooting aids, etc. It is understood that all such variations are within the scope of the present disclosure.

Also, any logic or application described herein, including in the AMI application 115, that comprises software or code can be embodied in any non-transitory computer-readable medium for use by or in connection with an instruction execution system such as, for example, a processor 803 in a computer system or other system. In this sense, the logic may comprise, for example, statements including instructions and declarations that can be fetched from the computer-readable medium and executed by the instruction execution system. In the context of the present disclosure, a "computer-readable medium" can be any medium that can contain, store, or maintain the logic or application described herein for use by or in connection with the instruction execution system. The computer-readable medium can comprise any one of many physical media such as, for example, magnetic, optical, or semiconductor media. More specific examples of a suitable computer-readable medium would include, but are not limited to, magnetic tapes, magnetic floppy diskettes, magnetic hard drives, memory cards, solid-state drives, USB flash drives, or optical discs. Also, the computer-readable medium may be a random access memory (RAM) including, for example, static random access memory (SRAM) and dynamic random access memory (DRAM), or magnetic random access memory (MRAM). In addition, the computer-readable medium may be a read-only memory (ROM), a programmable read-only memory (PROM), an erasable programmable read-only memory (EPROM), an electrically erasable programmable read-only memory (EEPROM), or other type of memory device.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

Therefore, the following is claimed:

1. A system, comprising:
a plurality of metering devices individually positioned at a plurality of locations, each of the plurality of metering devices comprising a voltage sensor or a current sensor used to detect a power outage, the plurality of metering devices comprising a radio frequency (RF) transceiver;
at least one computing device; and
an advanced metering infrastructure (AMI) application executable in the at least one computing device, the AMI application causing the at least one computing device to least:
transmit a command to the plurality of metering devices, wherein the command instructs the plurality of metering device to report power usage data;
receive a power outage status of a first one of the plurality of metering devices, the power outage status representing the power outage at a first location of the first one of the plurality of metering devices, wherein the power outage status is received at an instance after the first one of the plurality of metering devices received the command, the power outage status being transmitted by the RF transceiver of the first one of the plurality of metering devices at a point in which the power outage can be detected from a measurement from the voltage sensor or the current sensor;
determine that a quantity of the plurality of metering devices is within a radius from the first location and that the quantity exceeds a threshold quantity;
determine a subset of the plurality of metering devices that have a density reachable location from the first location based at least in part on executing a density-based spatial clustering of application with noise (DBSCAN) measurement from the first location;
determine a cluster area from the first location and a corresponding location associated with each of the subset of the plurality of metering devices;
determine that a quantity of the plurality of metering devices in the cluster area exceeds a density threshold quantity;
adjust a size of the cluster area by modifying the radius of the cluster area based at least in part on the determination of the quantity of the plurality of metering devices exceeding the density threshold quantity; and
determine that at least one measurement of the cluster area indicates a storm event.

2. The system of claim 1, wherein the storm event indicates a tornado event that has contacted a structure on a ground surface.

3. The system of claim 2, wherein the at least one measurement further comprises a comparison between a plurality of dimensions associated with the cluster area and a plurality of dimensions associated with a predefined tornado pattern.

4. The system of claim 1, wherein the density reachable location comprises a respective location of one of the plurality of metering devices being within a density-connected distance.

5. The system of claim 1, wherein the density reachable location comprises a respective location of one of the plurality of metering devices being with at least one of a density-reachable distance or a directly density-reachable distance.

6. The system of claim 1, further causing the at least one computing device to at least determine a direction associated with a storm event based at least in part on a correlation of at least two metering devices of the plurality of metering devices in the cluster area and a power outage timestamp associated with each of the at least two metering devices of the plurality of metering devices.

7. The system of claim 1, further causing the at least one computing device to at least determine a speed associated with the storm event based at least in part on the corresponding location associated with at least two metering devices in the subset of the plurality of metering devices and a corresponding timestamp associated with the at least two metering devices of the subset of the plurality of metering devices, the corresponding timestamp indicating a point in time for the power outage.

8. A method comprising:
identifying, in a computing device, a metering data stream from a plurality of metering devices individually positioned at a plurality of locations, each of the plurality of metering devices comprising a voltage sensor or a current sensor used to detect a power outage, the plurality of metering devices comprising a transceiver, the metering data stream comprising a power outage status representing the power outage at a first location for a first one of the plurality of metering devices, the power outage status being transmitted by the transceiver of the first one of the plurality of metering devices;
determining, in the computing device, that a quantity of the plurality of metering devices is within a radius from the first location of the first one of the plurality of metering devices and that the quantity exceeds a threshold quantity;
performing, in the computing device, a density-based spatial clustering of application with noise (DBSCAN) measurement that identifies a subset of the plurality of metering devices within a reachable location with respect to the first location;
determining, in the computing device, a cluster area from the first location and a corresponding location associated with each of metering devices in the subset of the plurality of metering devices;
determining, in the computing device, that the quantity of the plurality of metering devices in the cluster area exceeds a density threshold quantity;
adjusting, in the computing device, a size of the cluster area by modifying the radius of the cluster area based at least in part on the determination of the quantity of the plurality of metering devices exceeding the density threshold quantity; and
determining, in the computing device, that at least one measurement of the cluster area indicates a storm event.

9. The method of claim 8, wherein the DBSCAN measurement comprises at least one of a density-connected measurement, a density-reachable measurement, or a directly density-reachable measurement.

10. The method of claim 8, further comprising determining a direction associated with the storm event based at least in part on a correlation of at least two metering devices of the plurality of metering devices in the cluster area and a respective power outage timestamp associated with each of the at least two metering devices of the plurality of metering devices.

11. The method of claim 10, further comprising determining a speed associated with the storm event based at least in part on the corresponding location associated with at least two metering devices of the subset of the plurality of metering devices and the respective power outage timestamp associated with the at least two metering devices of the subset of the plurality of metering devices.

12. The method of claim 11, wherein the storm event indicates a tornado event, and the method further comprises determining, in the computing device, a tornado path prediction associated with the tornado event based at least in part on an extrapolation of the speed and the direction.

13. The method of claim 12, wherein the tornado path prediction comprises a prediction of a plurality of powered metering devices to experience a power outage within a calculated time period.

14. A system, comprising:
a plurality of metering devices individually positioned in a plurality of locations, each of the plurality of metering devices comprising a sensor used to detect a power outage, the plurality of metering devices comprising a radio frequency (RF) transceiver;
at least one computing device; and
an advanced metering infrastructure (AMI) application executable in the at least one computing device, the AMI application causing the at least one computing device to least:
receive a metering data stream from a metering database, the metering data stream comprising a power outage status for one of a plurality of metering devices, the power outage status representing the power outage at a respective location of the one of the plurality of metering devices, the power outage status being transmitted by the RF transceiver of the one of the plurality of metering devices at a point in which the power outage can be detected from a power measurement from the sensor;
determine that a quantity of the plurality of metering devices is within a radius from the respective location of the one of the plurality of metering devices and that the quantity exceeds a threshold quantity;
generate a cluster area from the respective location of the one of the plurality of metering devices based at least in part on performing a density-based spatial clustering of application with noise (DBSCAN) measurement, the cluster area comprising some of the plurality of metering devices;
determine that the quantity of the plurality of metering devices in the cluster area exceeds a density threshold quantity;
adjust a size of the cluster area based at least in part on the determination of the quantity of the plurality of metering devices exceeding the density threshold quantity; and
determine that at least one measurement of the cluster area indicates a tornado event.

15. The system of claim 14, wherein generating the cluster area comprises identifying a subset of the plurality of metering devices within a reachable location with respect to the respective location based at least in part on the DBSCAN measurement.

16. The system of claim 15, wherein the adjustment of the size of the cluster area further comprises adjusting the size of the cluster area from the respective location of the one of the plurality of metering devices.

17. The system of claim 16, further causing the at least one computing device to at least determine a speed associated with the tornado event based at least in part on a corresponding location associated with at least two metering devices in the subset of the plurality of metering devices and a corresponding timestamp associated with the at least two metering devices of the subset of the plurality of metering devices, the corresponding timestamp indicating a point in time for the power outage.

18. The system of claim 14, further causing the at least one computing device to at least determine a direction associated with the tornado event based at least in part on a correlation of at least two metering devices of the plurality of metering devices in the cluster area and a corresponding timestamp associated with each of the at least two metering devices of the plurality of metering devices, the corresponding timestamp indicating a point in time for the power outage.

19. The system of claim 14, wherein the adjustment of the size of the cluster area further comprises reducing the quantity of the plurality of metering devices in the cluster area.

20. The system of claim 14, wherein the power outage status is received from the RF transceiver of the first one of the plurality of metering devices by way of at least one of a communications tower, a vehicle mounted metering collection device, and a mobile collector.

* * * * *